United States Patent
Hattori et al.

(10) Patent No.: US 9,209,263 B2
(45) Date of Patent: Dec. 8, 2015

(54) SEMICONDUCTOR MEMORY DEVICE

(71) Applicant: Kabushiki Kaisha Toshiba, Minato-ku (JP)

(72) Inventors: Shigeki Hattori, Kawasaki (JP); Masaya Terai, Kawasaki (JP); Hideyuki Nishizawa, Toshima (JP); Koji Asakawa, Kawasaki (JP); Yoshiaki Fukuzumi, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/658,651

(22) Filed: Mar. 16, 2015

(65) Prior Publication Data

US 2015/0263127 A1   Sep. 17, 2015

(30) Foreign Application Priority Data

Mar. 17, 2014   (JP) ................. 2014-054069

(51) Int. Cl.
*H01L 51/00* (2006.01)
*H01L 29/51* (2006.01)
*H01L 29/792* (2006.01)
*H01L 27/115* (2006.01)

(52) U.S. Cl.
CPC ........ *H01L 29/518* (2013.01); *H01L 27/11565* (2013.01); *H01L 27/11568* (2013.01); *H01L 27/11582* (2013.01); *H01L 29/513* (2013.01); *H01L 29/517* (2013.01); *H01L 29/792* (2013.01)

(58) Field of Classification Search
CPC ...................................... H01L 51/00
USPC ................................................ 257/40
See application file for complete search history.

(56) References Cited

U.S. PATENT DOCUMENTS

| | | | |
|---|---|---|---|
| 8,815,412 B2 * | 8/2014 | Kadoma et al. ............ 428/690 |
| 2003/0111670 A1 | 6/2003 | Misra et al. |
| 2005/0048691 A1 | 3/2005 | Bocian et al. |
| 2005/0270822 A1 | 12/2005 | Shrivastava et al. |
| 2008/0191256 A1 | 8/2008 | Bidan et al. |
| 2009/0230449 A1 | 9/2009 | Sakaguchi et al. |
| 2010/0163108 A1 | 7/2010 | Bessho et al. |
| 2012/0112171 A1 | 5/2012 | Hattori et al. |
| 2012/0241713 A1 | 9/2012 | Nishizawa et al. |
| 2014/0008601 A1 | 1/2014 | Nishizawa et al. |

FOREIGN PATENT DOCUMENTS

| | | |
|---|---|---|
| JP | 2007-502013 | 2/2007 |
| JP | 2007-538388 | 12/2007 |
| JP | 2008-053631 | 3/2008 |
| JP | 2009-081444 | 4/2009 |
| JP | 2012-104675 | 5/2012 |
| JP | 2012-204433 | 10/2012 |
| JP | 2012-204434 | 10/2012 |

* cited by examiner

*Primary Examiner* — Marc Armand
(74) *Attorney, Agent, or Firm* — Oblon, McClelland, Maier & Neustadt, L.L.P.

(57) ABSTRACT

A nonvolatile semiconductor memory device includes a semiconductor layer, a control gate electrode, and an organic molecular layer provided between the semiconductor layer and the control gate electrode and having an organic molecule including a porphyrin structure.

20 Claims, 11 Drawing Sheets

SEMICONDUCTOR MEMORY DEVICE

CROSS-REFERENCE TO RELATED APPLICATION

This application is based upon and claims the benefit of priority from Japanese Patent Application No. 2014-054069, filed on Mar. 17, 2014, the entire contents of which are incorporated herein by reference.

FIELD

Embodiments described herein relate generally to semiconductor memory devices.

BACKGROUND

As a method for achieving a reduction in bit cost and increasing the memory performance of nonvolatile semiconductor memory devices, a method of scaling down the dimensions of a memory cell is effective. However, scaling down of a memory cell is becoming technically difficult.

Thus, it has been proposed to use organic molecules for a charge memory layer. Organic molecules can be formed by organically combining various molecular structures and substituents. Thus, desired electrochemical properties can be provided. Also, the smallness of their building units provides the possibility of being able to achieve scaling down of a memory cell.

For a nonvolatile semiconductor memory device using organic molecules in a charge memory layer, a further improvement in charge retention characteristics is desired.

DETAILED DESCRIPTION

Figure 1:
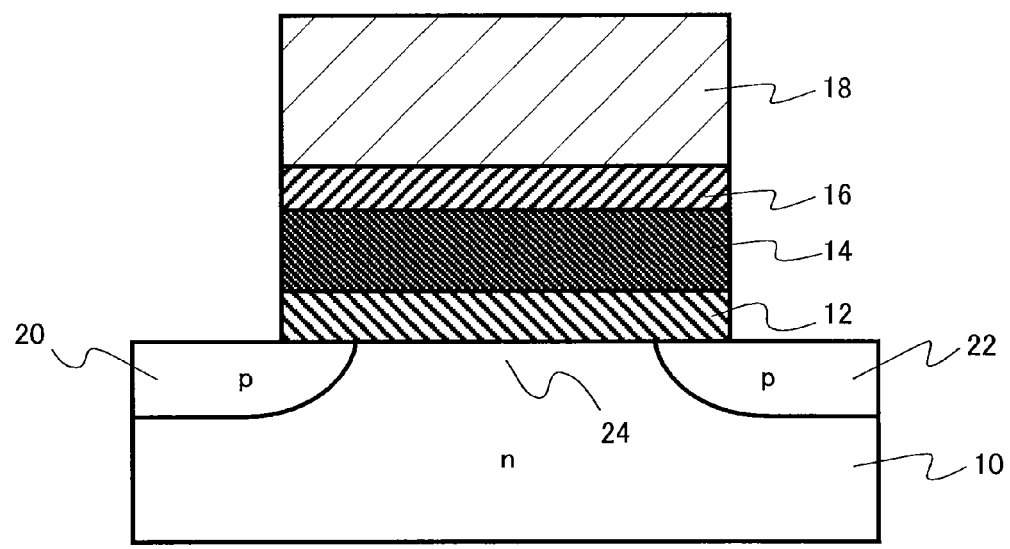
FIG. 1 is a cross-sectional view of a memory cell portion of a nonvolatile semiconductor memory device in a first embodiment.

A nonvolatile semiconductor memory device in this embodiment includes a semiconductor layer, a control gate electrode, and an organic molecular layer provided between the semiconductor layer and the control gate electrode and having an organic molecule including a molecular structure described by a molecular formula (1).

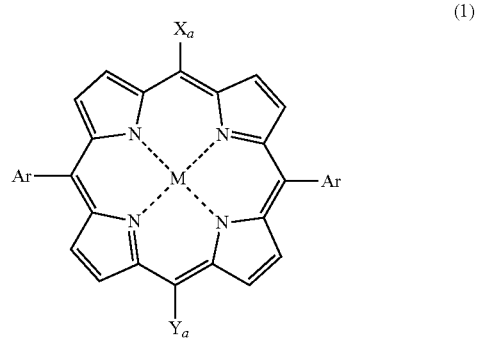

(1)

wherein $X_a$ is an aryl group having a substituent selected from a nitro group, an amino group, a tosyl group, an alkylamino group, a cyano group, and a fluoro group, $Y_a$ is an aryl group different from $X_a$, Ar is an aryl group different from $X_a$, and M is a metal ion selected from Zn, Fe, Mn, Pt, Ni, and Co.

In the description, the same or similar members are denoted by the same reference numerals, and redundant descriptions will not be made.

In the description, in order to express relative positional relationships between components or others, the words "upper" and "lower" are used. In the description, the words "upper" and "lower" are not necessarily intended to express relationships with the direction of gravity.

In the description, the word "aryl group" means a generic name of groups arising from desorption of one hydrogen atom bonded to a ring of aromatic hydrocarbon, for example, a phenyl group, a tolyl group, a naphthyl group, and the like.

Hereinafter, embodiments will be described with reference to the drawings.

First Embodiment

A nonvolatile semiconductor memory device in this embodiment includes a semiconductor layer, a control gate electrode, and an organic molecular layer provided between the semiconductor layer and the control gate electrode and having an organic molecule including a molecular structure described by the molecular formula (1).

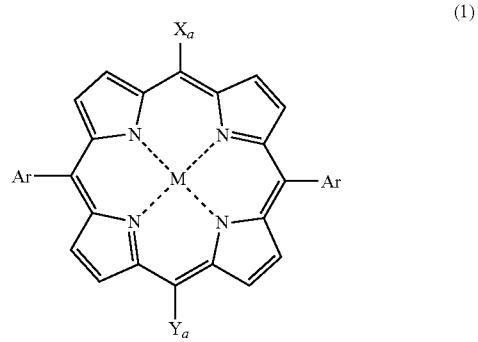

(1)

wherein $X_a$ is an aryl group having a substituent selected from a nitro group, an amino group, a tosyl group, an alkylamino group, a cyano group, and a fluoro group, $Y_a$ is an aryl group different from $X_a$, Ar is an aryl group different from $X_a$, and M is a metal ion selected from Zn, Fe, Mn, Pt, Ni, and Co.

The device further includes a tunnel insulating film provided between the semiconductor layer and the organic molecular layer, and a block insulating film provided between the organic molecular layer and the control gate electrode.

The semiconductor memory device in this embodiment has the organic molecular layer constituting a charge memory layer between the tunnel insulating film and the block insulating film. The molecular structure of the organic molecules constituting the organic molecular layer has a porphyrin derivative containing a polar group.

The semiconductor memory device in this embodiment has the above configuration, thereby imparting a large dipole moment to molecules. Thus, it facilitates retention of charges in the charge memory layer. Therefore, the charge retention characteristics (data retention characteristics) of the memory cell are improved.

Figure 2:
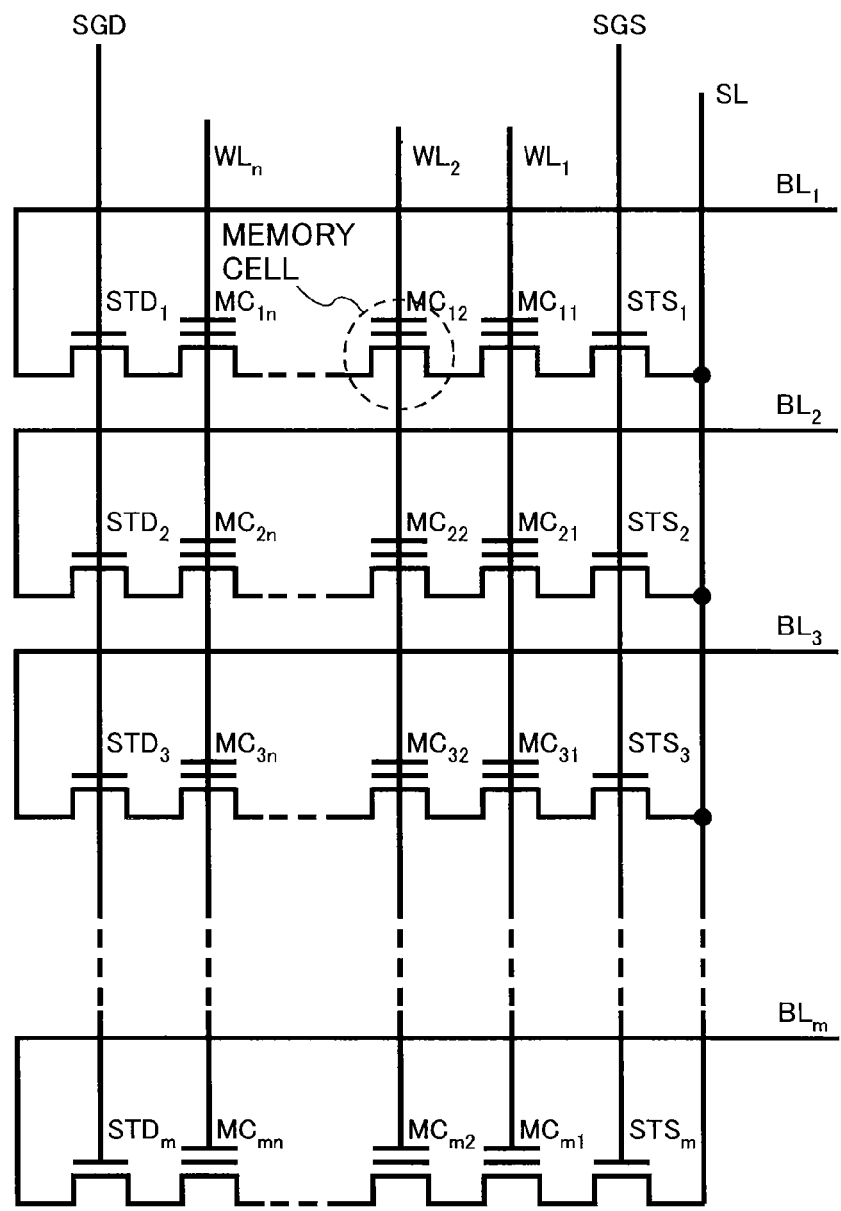
FIG. 2 is a circuit diagram of a memory cell array of the nonvolatile semiconductor memory device in the first embodiment.

FIG. 1 is a cross-sectional view of a memory cell portion of a nonvolatile semiconductor memory device in this embodiment. FIG. 2 is a circuit diagram of a memory cell array of the nonvolatile semiconductor memory device in this embodiment. The nonvolatile semiconductor memory device in this embodiment is a NAND type nonvolatile semiconductor memory device.

As shown in FIG. 2, the memory cell array is composed of memory cell transistors $MC_{11}$ to $MC_{1n}$, $MC_{21}$ to $MC_{2n}$, ..., $MC_{m1}$ to $MC_{mn}$ that are m×n (m and n are integers) transistors having a floating gate structure, for example. In the memory cell array, these memory cell transistors are aligned in a column direction and a row direction, whereby the memory cell transistors are arranged in a matrix.

In the memory cell array, the memory cell transistors $MC_{11}$ to $MC_{1n}$ and select gate transistors $STS_1$ and $STD_1$ are connected in series, constituting a NAND string (memory string) as a cell unit, for example.

A drain region of the select gate transistor $STS_1$ for selecting the memory cell transistors $MC_{11}$ to $MC_{1n}$ is connected to a source region of the memory cell transistor $MC_{11}$ located at an end of the row of a group of memory cell transistors $MC_{11}$ to $MC_{1n}$ connected in series. A source region of the select gate transistor $STD_1$ for selecting the memory cell transistors $MC_{11}$ to $MC_{1n}$ is connected to a drain region of the memory cell transistor $MC_{1n}$ located at an end of the row of the group of memory cell transistors $MC_{11}$ to $MC_{1n}$ connected in series.

Selective gate transistors $STS_2$ to $STS_m$, memory cell transistors $MC_{21}$ to $MC_{2n}$, ..., $MC_{m1}$ to $MC_{mn}$, and select gate transistors $STD_2$ to $STD_m$ are likewise connected in series separately, constituting NAND strings.

A common source line SL is connected to sources of the select gate transistors $STS_1$ to $STS_m$. The memory cell transistors $MC_{11}$, $MC_{21}$, ..., $MC_{m1}$, memory cell transistors $MC_{12}$, $MC_{22}$, ..., $MC_{m2}$, ..., memory cell transistors $MC_{1n}$, $MC_{2n}$, ..., $MC_{mn}$ are connected with word lines $WL_1$ to $WL_n$ for controlling an operating voltage applied to the control gate electrodes, respectively.

A common select gate line SGS for the select gate transistors $STS_1$ to $STS_m$ and a common select gate line SGD for the select gate transistors $STD_1$ to $STD_m$ are also provided.

A peripheral circuit not shown for controlling the memory cell array is formed around the memory cell array in FIG. 2.

FIG. 1 shows a cross section of a memory cell in the memory cell array shown in FIG. 2, for example, a memory cell enclosed by a dotted line in FIG. 2. In this embodiment, description will be made of a case where a transistor of a memory cell is a p-type transistor using holes as carriers as an example.

The memory cell is formed on a semiconductor layer 10 of n-type silicon containing n-type impurities, for example. The memory cell includes a tunnel insulating film 12 on the silicon semiconductor layer 10, an organic molecular layer (charge storage layer) 14 on the tunnel insulating film 12, a block insulating film 16 on the charge storage layer 14, and a control gate electrode 18 on the block insulating film 16. A source region 20 and a drain region 22 are formed in the semiconductor layer 10 on opposite sides of the control gate electrode 18. A region in the semiconductor layer 10 below the control gate electrode 18 constitutes a channel region 24. The channel region 24 is interposed between the source region 20 and the drain region 22.

Here, the charge storage layer 14 has the function of actively storing charges as memory cell information. The tunnel insulating film 12 serves as an electron-hole transfer pathway between the channel region 24 in the semiconductor layer 10 and the charge storage layer 14 due to a tunneling phenomenon during writing into and erasing from the memory cell. The tunnel insulating film 12 also has the function of preventing electron-hole transfer between the channel region 24 and the charge storage layer 14 by its barrier height during reading and standby. The block insulating film 16 is a so-called interelectrode insulating film, and has the function of blocking flow of electrons and holes between the charge storage layer 14 and the control gate electrode 18.

For the semiconductor layer 10, silicon germanide, germanium, a compound semiconductor, or the like other than silicon can be used.

The tunnel insulating film 12 is a silicon oxide ($SiO_2$) film, for example. The material of the tunnel insulating film 12 is not limited to a silicon oxide shown by example. Other insulating films can be used as appropriate.

The tunnel insulating film 12 with a larger thickness has higher insulation properties, reducing the escape of stored charges more. However, too much thickness undesirably increases the film thickness of the nonvolatile semiconductor memory device itself. Therefore, the tunnel insulating film 12 is 10 nm or less, and desirably 5 nm or less. The above-described thicknesses are all physical film thicknesses.

The tunnel insulating film 12 may be a layered film. For example, another material can be laid thereon to accelerate chemical adsorption of the organic molecules constituting the organic molecular layer 14 to the tunnel insulating film surface. For example, it may be an aluminum oxide.

The charge storage layer 14 is made of a monomolecular film, for example. The thickness of the charge storage layer 14 is desirably 2 nm or less in terms of miniaturization of the memory cell.

The block insulating film 16 is a metal oxide film, for example, a hafnium oxide. Other than the above-described hafnium oxide ($HfO_2$), an aluminum oxide ($Al_2O_3$), a silicon oxide, a zirconium oxide, a titanium oxide, or the like, for example, may be used for the block insulating film 16.

The block insulating film 16 with a larger thickness has higher insulation properties, reducing the escape of stored charges more. However, too much thickness undesirably increases the film thickness of the nonvolatile semiconductor memory device itself. Therefore, the block insulating film 16 is at most 20 nm or less, and desirably 10 nm or less.

The block insulating film 16 may be a single-layer film or a layered film. The block insulating film 16 is a metal oxide film formed by an atomic layer deposition (ALD) method, for example.

The control gate electrode 18 is polycrystalline silicon to which impurities have been introduced and conductivity has been imparted, for example. For the control gate electrode 18, any conductive material may be used. Other than the above-described polycrystalline silicon, for example, amorphous silicon to which impurities have been introduced and conductivity has been imparted, or the like may be used for the control gate electrode 18. Alternatively, a metal, an alloy, a metal semiconductor compound, or the like may be used for the control gate electrode 18.

The source region 20 and the drain region 22 are formed by a p-type diffusion layer containing p-type impurities, for example.

Figure 3:
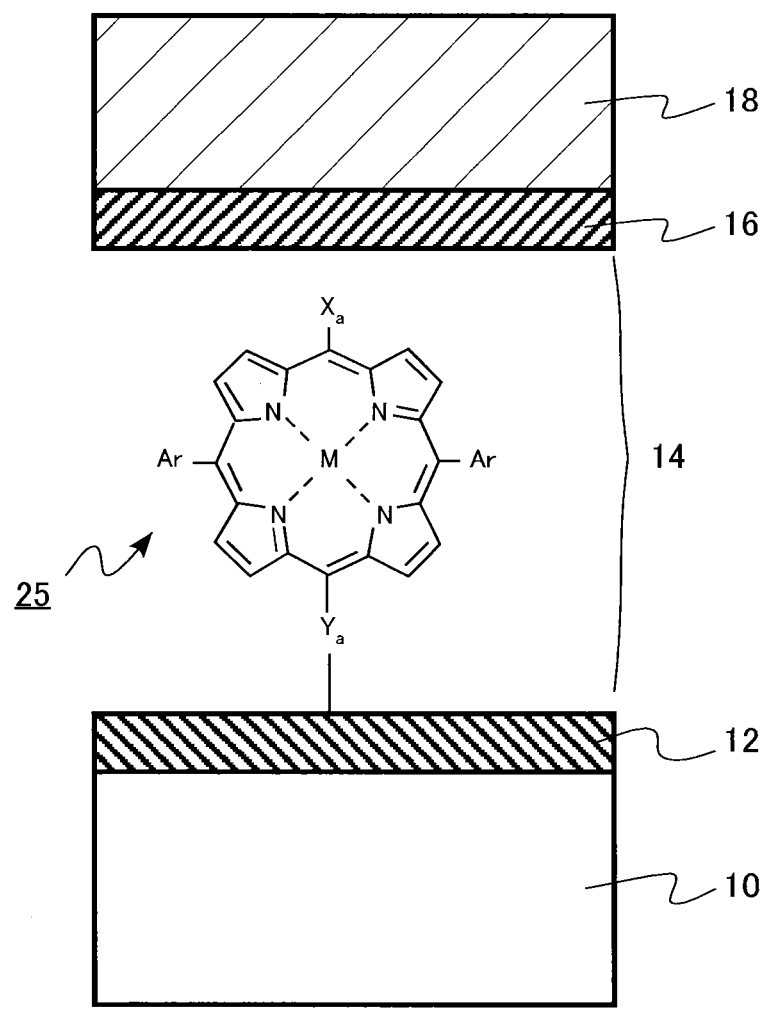
FIG. 3 is an enlarged schematic diagram of the memory cell portion of the nonvolatile semiconductor memory device in the first embodiment.

FIG. 3 is an enlarged schematic diagram of an example of the memory cell portion of the semiconductor memory device in this embodiment. It is a diagram showing details of the structure and adsorption form of an organic molecule used in the charge storage layer 14.

The charge storage layer 14 is composed of organic molecules (charge storage molecules) 25. The charge storage molecules 25 have the function of storing charges to provide data on the memory cell. The charge storage layer 14 is a monomolecular film, for example.

The charge storage molecule 25 in the memory cell shown in FIG. 3 has a molecular structure described by the following molecular formula (1):

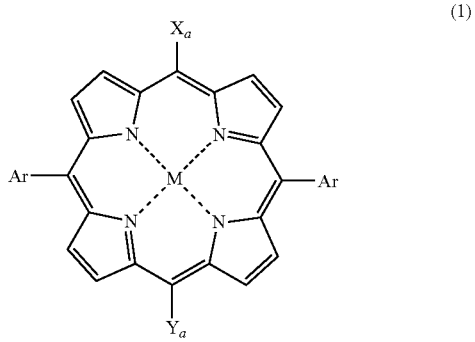

(1)

In the molecular formula (1), M is a metal ion, and desirably one that stabilizes the porphyrin derivative in chemical structure. In terms of chemical structural stability, M is desirably a metal ion selected from zinc (Zn), iron (Fe), manganese (Mn), platinum (Pt), nickel (Ni), and cobalt (Co).

In the molecular formula (1), $X_a$ is an aryl group having a substituent that imparts a large dipole moment to the molecule. The substituent is a polar group. The introduction of the polar group imparts a large dipole moment to the molecule. The large dipole moment encloses stored charges, working to make them close to being electroneutral. As a result, the stored charges can be stabilized. Examples of the polar group include a nitro group, an amino group, a tosyl group, an alkylamino group, a cyano group, a fluoro group, and others.

In the molecular formula (1), Ar is an aryl group different from $X_a$, and is desirably one that stabilizes the porphyrin derivative in chemical structure, and imparts solubility in a solvent to the porphyrin derivative. Both in terms of chemical structural stabilization of the porphyrin derivative and in terms of high solubility in an organic solvent, it is desirably an aryl group. The aryl group is an aromatic group such as a phenyl group, a naphthyl group, or an acetyl group, and may have a structure in which an alkyl group such as a methyl group, an ethyl group, or a propyl group is introduced in an aromatic ring.

In the molecular formula (1), $Y_a$ is an aryl group different from $X_a$. The organic molecule 25 is chemically bonded to the semiconductor layer 10 side or the control gate electrode 18 side via $Y_a$. For example, the organic molecule 25 is chemically bonded to the tunnel insulating film 12 via $Y_a$.

$Y_a$ has a chemically modifying group (substituent) called a linker. The organic molecule 25 is chemically bonded to the semiconductor layer 10 side or the control gate electrode 18 side via the linker. The organic molecule 25 is chemically bonded to the tunnel insulating film 12 via the linker, so that the organic molecular layer 14 becomes a monomolecular film.

Examples of the chemically modifying group to be a linker include an ether group, a silyl ether group, a dimethylsilyl ether group, a diethylsilyl ether group, a carboxy ester group, a sulfonyl ester group, a phosphonic ester group, an amide group, a thioether group, and others.

Ease of bond formation differs depending on a base used. Thus the most suitable chemical structure of the linker differs depending on the base. For a semiconductor member or an insulating film such as a metal oxide, an ether group, a silyl ether group, a dimethylsilyl ether group, a diethylsilyl ether group, a carboxy ester group, a sulfonyl ester group, a phosphonic ester group, an amide group, or the like is desirable, for example. In terms of ease of organic synthesis and chemical reactivity with a metal oxide, a silyl ether group, a dimethylsilyl ether group, a diethylsilyl ether group, or a phosphonic ester group is desirable. In particular, when the metal oxide is an aluminum oxide, a phosphonic ester group is desirable.

$Y_a$ may contain an alkyl group, a phenyl group, or the like to be a spacer. Thus, an alkyl chain, a phenyl chain, or the like to be a spacer may be contained between the above-described chemically modifying group providing a chemical structure forming the bond and the porphyrin structure.

In terms of facilitating the synthesis of the organic molecule 25 and in terms of heat resistance, $X_a$, $A_r$, and $Y_a$ in the molecular formula (1) desirably contain a phenyl group. In terms of facilitating the synthesis of the organic molecule 25, Ar in the molecular formula (1) is desirably an aryl group composed only of carbon and hydrogen.

The organic molecule 25 desirably contains a molecular structure described by the following molecular formula (2):

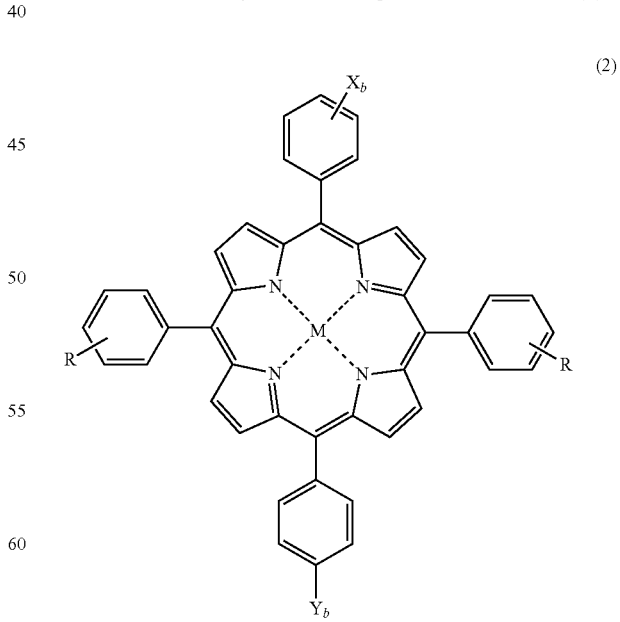

(2)

In the molecular formula (2), M is a metal ion, and desirably one that stabilizes the porphyrin derivative in chemical structure. In terms of chemical structural stability, M is desirably a metal ion selected from zinc (Zn), iron (Fe), manganese (Mn), platinum (Pt), nickel (Ni), and cobalt (Co).

In the molecular formula (2), $X_b$ is a polar group that imparts a large dipole moment to the molecule. Like $X_a$ in the molecular formula (1), by the introduction of the polar group, the large dipole moment encloses stored charges, working to make them close to being electroneutral. As a result, the stored charges can be stabilized. Examples of the polar group include a nitro group, an amino group, a tosyl group, an alkylamino group, a cyano group, a fluoro group, and others.

In the molecular formula (2), R is a saturated aliphatic group. An ether linkage may be contained in the saturated aliphatic group. By bonding saturated aliphatic group R to a side chain of a phenyl group, the molecule storing charges is spatially separated from the insulating film, the semiconductor, and other molecules surrounding the molecule. This reduces the escape of the stored charges to the surrounding area, providing a longer time charge retention effect. A plurality of R may be bonded to the benzene ring in the molecular formula (2).

In the molecular formula (2), $Y_b$ is a chemically modifying group called a linker. Examples of the linker include an ether group, a silyl ether group, a dimethylsilyl ether group, a diethylsilyl ether group, a carboxy ester group, a sulfonyl ester group, a phosphonic ester group, an amide group, a thioether group, and others.

$Y_b$ may contain an alkyl group, a phenyl group, or the like to be a spacer. Thus, an alkyl chain, a phenyl chain, or the like to be a spacer may be contained between the above-described chemically modifying group providing a chemical structure forming the bond and the porphyrin structure. Like R in the molecular formula (2), a plurality of $Y_b$ may be bonded to the benzene ring in the molecular formula (2).

By making a portion closest to a porphyrin ring a phenyl chain as in the molecular formula (2), synthesis of the porphyrin ring is facilitated.

The organic molecules 25 more desirably contain a molecular structure described by the following molecular formula (3):

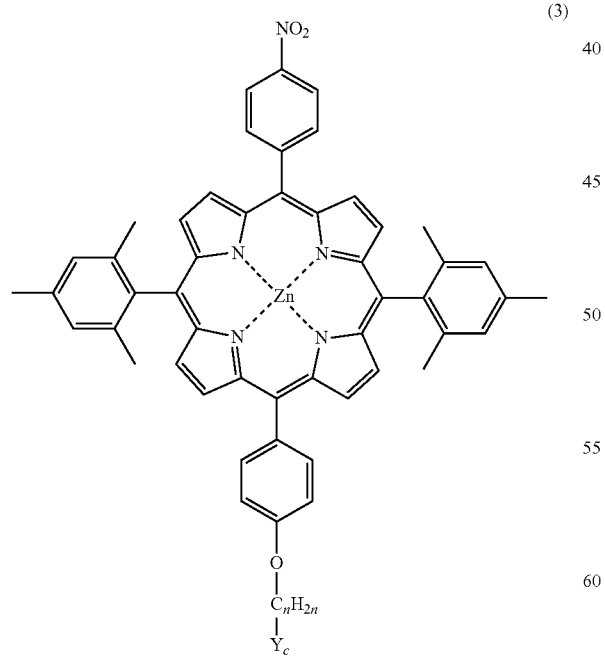

(3)

In the molecular structure described by the molecular formula (3), M in the molecular formula (2) is zinc (Zn). In terms of ease in synthesis and stability of the molecular structure, M is desirably zinc (Zn).

In the molecular structure described by the molecular formula (3), $X_b$ in the molecular formula (2) is a nitro group. Being the nitro group, $X_b$ generates a very large dipole moment. This provides a great effect of stabilizing stored charges due to the dipole moment.

In the molecular structure described by the molecular formula (3), R in the molecular formula (2) is a chemical structure in which a total of three methyl groups are bonded to ortho positions and a para position. This structure facilitates synthesis of the organic molecule 25.

In the molecular structure described by the molecular formula (3), $Y_b$ in the molecular formula (2) contains an alkyl chain to be a spacer. In the molecular formula (3), n in $C_nH_{2n}$ is an integer of one or more to thirty or less, and a saturated alkyl chain in a straight chain is formed. $Y_c$ is a linker.

The saturated alkyl chain located between the phenyl group and the linker $Y_c$ allows the molecule storing charges to be spatially separated from the semiconductor layer 10, the control gate electrode 18, and the like. This reduces the escape of the stored charges from the organic molecular layer 14, providing a longer time charge retention effect.

The organic molecules 25 still more desirably contain a molecular structure described by the following molecular formula (4):

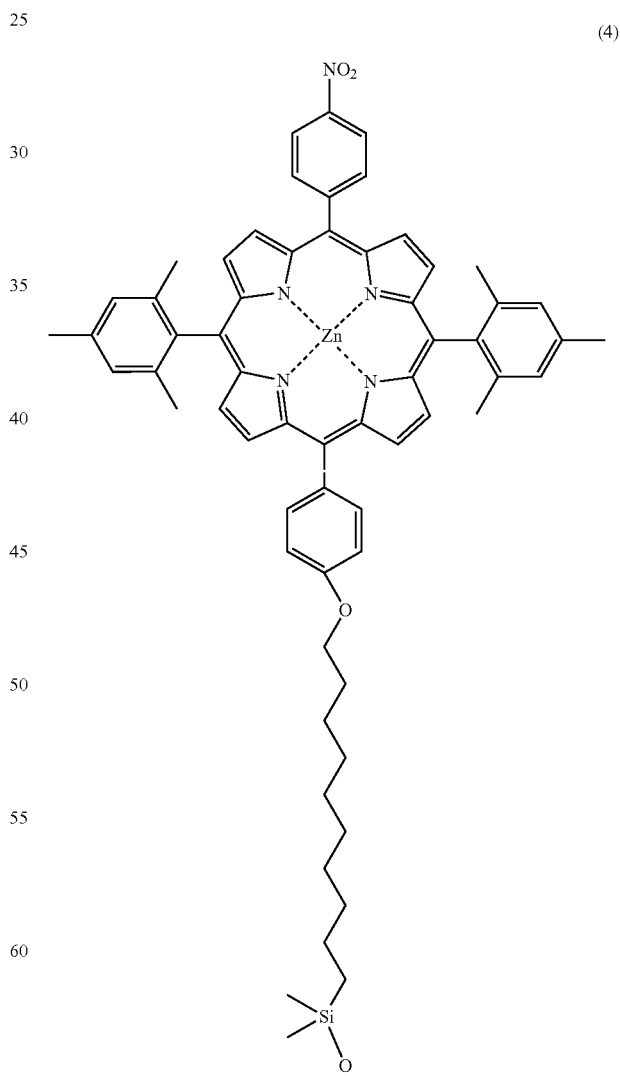

(4)

In the molecular formula (4), $C_nH_{2n}$ in the molecular formula (3) is a decylene chain in which n is ten. In terms of ease in synthesis and reducing the escape of stored charges by spatially separating the molecule storing charges from the semiconductor layer 10, the control gate electrode 18, and the like, $C_nH_{2n}$ is desirably a decylene chain.

In the molecular formula (4), $Y_c$ in the molecular formula (3) is a dimethylsilyl ether group. In terms of the capability of easily reacting with various materials to form a monomolecular film, and in terms of ease in synthesis, $Y_c$ is desirably a dimethylsilyl ether group.

Results of determining dipole moments on some molecules having the structure of the above-described molecular formula (1) are shown. Dipole moments were determined by performing molecular orbital calculation for the structural optimization of the molecular structures of chemical formulae shown in Table 1 below. For a molecular orbital calculation technique, PM5 parameters of the molecular orbital method (MO method) were used. Derivatives of a porphyrin ring to which a dimethylethoxysilyldecylphenyl group was bonded as a linker in a state before forming a charge storage monomolecular film on a base were studied.

Molecular structures in which a nitro group was introduced as a polar group in Molecule Example 1, a cyano group in Molecule Example 2, a tosyl group in Molecule Example 3, fluorine in Molecule Example 4, an amino group in Molecule Example 5, a dimethylamino group in Molecule Example 6, and chlorine in Molecule Example 7 were studied. A comparative molecule example had a structure in which a polar group was not introduced for comparison.

Calculation results are shown in Table 1. While the dipole moment in the comparative molecule example was 2.654 Debye, the dipole moments in Molecule Examples 1 to 7 were larger values. In particular, Molecule Example 1 in which a nitro group was introduced had the largest value of 8.409 Debye. From the above, it is clear that introduction of a polar group in a porphyrin ring can provide a large dipole moment.

As described above, a large dipole moment facilitates retention of charges in the charge storage layer 14. Thus, the charge retention characteristics (data retention characteristics) of the nonvolatile semiconductor memory device in this embodiment are improved.

TABLE 1

| | Chemical Formula | Dipole Moment |
|---|---|---|
| Molecule Example 1 | | 8.409 Debye |
| Molecule Example 2 | | 5.579 Debye |

TABLE 1-continued

| | Chemical Formula | Dipole Moment |
|---|---|---|
| Molecule Example 3 | | 5.782 Debye |
| Molecule Example 4 | | 4.440 Debye |
| Molecule Example 5 | | 3.451 Debye |
| Molecule Example 6 | | 3.715 Debye |

TABLE 1-continued

| | Chemical Formula | Dipole Moment |
|---|---|---|
| Molecule Example 7 | | 3.654 Debye |
| Molecule Comparative Example | | 2.654 Debye |

In addition to the excellent charge retention characteristics, the nonvolatile semiconductor memory device in this embodiment has high heat resistance of the charge storage molecules 25 due to the introduction of four aryl groups in a porphyrin ring. Hereinafter, evaluation results on heat resistance when aryl groups are used as phenyl groups are shown.

Thermal stability of a porphyrin derivative having four phenyl groups was determined using a thermal desorption spectroscopy (TDS) method. For the porphyrin derivative, a compound shown in the molecule comparative example in Table 1 was used as a typical porphyrin derivative having four phenyl groups.

A silicon substrate was immersed into a solution in which the porphyrin derivative shown in the molecule comparative example was dissolved in dehydrated toluene at a concentration of 1 mM, to which trifluoroacetic acid was added at a concentration of 3%, and was left for twenty-four hours. Thereafter, the substrate was put out from the solution, moved into pure toluene, and rinsed while being given stimulus by an ultrasonic cleaning machine for one minute. The rinse operation with toluene was performed two times in total with toluene replaced with new one.

Further, the substrate rinsed with toluene was moved into pure ethanol, rinsed while being given stimulus by an ultrasonic cleaning machine for one minute, and dried using an air duster, to form a monomolecular film made from the material in the molecule comparative example on the silicon substrate. Thermal desorption spectroscopy was performed on the substrate formed with the monomolecular film made from the material in the molecule comparative example.

Figure 4:
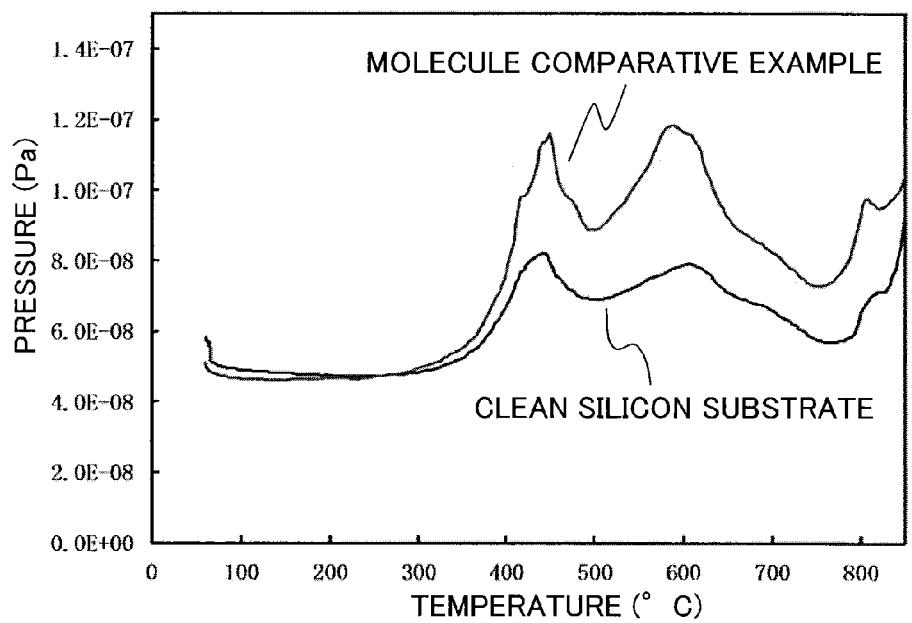
FIG. 4 is a diagram showing evaluation results on heat resistance of a porphyrin derivative.

FIG. 4 is a diagram showing evaluation results on heat resistance of the porphyrin derivative. FIG. 4 shows results of measurements of a substrate on which a monomolecular film made from the material in the molecule comparative example is formed and a clean silicon substrate on which a monomolecular film is not formed. As shown in FIG. 4, the molecule comparative example and the clean silicon substrate showed similar gas desorption tendencies.

Figure 5:
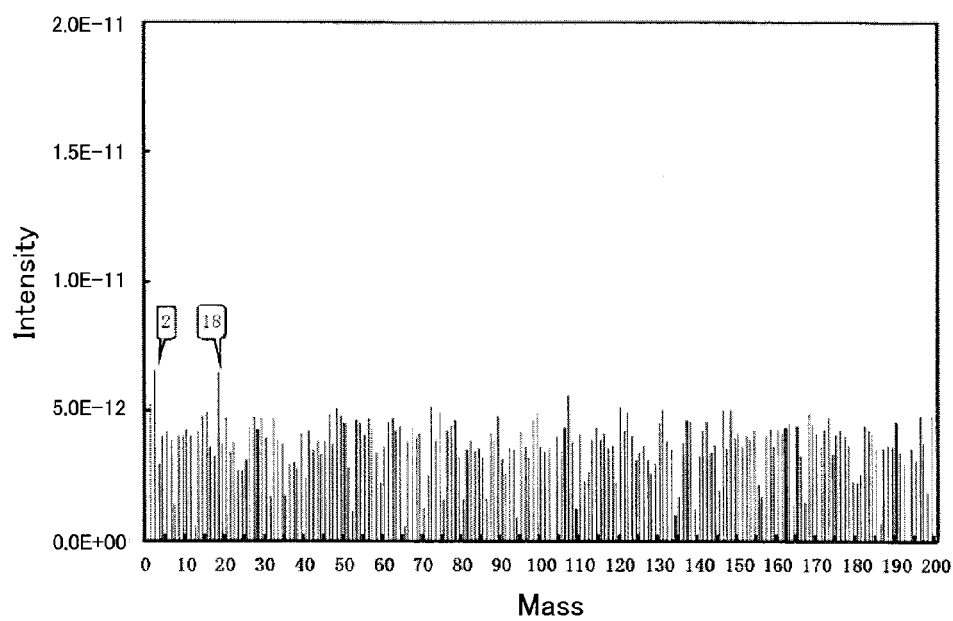
FIG. 5 is a diagram showing evaluation results on heat resistance of a porphyrin derivative.

FIG. 5 is a graph showing evaluation results on heat resistance of the porphyrin derivative. FIG. 5 shows results of a mass analysis performed on the gas at the peak shown in FIG. 4. As shown in FIG. 5, a peak at a mass of 18 was detected, which shows that the gas is moisture adsorbed to the substrate. Any gas arising from the porphyrin derivative such as carbon was not detected, so that it was found that the heat resistance of the monomolecular film of the porphyrin derivative shown in the molecule comparative example was very high. This is considered to be an effect of introducing the four phenyl groups in the porphyrin ring. Thus, the porphyrin derivatives in Molecule Examples 1 to 7 are considered to have high heat resistance likewise.

The charge storage molecules 25 can be detected by the following methods of analysis. Specifically, they can be detected by using a mass spectrometer (MS), a secondary ion mass spectrometer (SIMS), a nuclear magnetic resonator (NMR), an elemental analyzer, an infrared reflection absorption spectroscopy (IR-RAS), an X-ray fluorescence spectrometer (XRF), an X-ray photoelectron spectroscopy (XPS), an ultraviolet visible light spectrophotometer (UV-vis), a spectrofluorophotometer (FL), or the like.

When an insulating film such as a metal oxide is formed on the charge storage layer 14, it is analyzed while being cut off at the surface by a sputtering apparatus using argon ions or the like, for example. Alternatively, the charge storage layer 14 is dissolved and peeled simultaneously with the insulating film such as a metal oxide by a hydrofluoric acid aqueous solution or the like to analyze the solution.

In the above-described method of analysis by cutting off the surface by a spattering apparatus or the like, the cutting method may be heating treatment. In this case, a gas containing cut-off substances may be adsorbed by a different substance such as activated carbon, and then the different substance such as activated carbon on which the gas has been adsorbed may be analyzed for detection. In the above-described method of dissolving it by a hydrofluoric acid aqueous solution or the like for peeling and analyzing the solution, a solution containing substances dissolved and peeled may be subjected to decompression or heating treatment for concentration and then analyzed for detection.

In a memory cell writing operation in this embodiment, a voltage is applied between the control gate electrode 18 and the semiconductor layer 10 so that the control gate electrode 18 has a relatively negative voltage to store positive charges in the charge storage layer 14. When the control gate electrode 18 has a relatively negative voltage, an inversion layer is formed in the channel region 24 to store holes. The holes move through the tunnel insulating film 12 to be stored in the charge storage molecules in the charge storage layer 14.

In this state, the threshold of the transistor of the memory cell is higher compared with a state where holes are not stored. That is, it is a state where the transistor is hard to turn on. This state is a state where data "0" is written.

In a data erasing operation, a voltage is applied between the control gate electrode 18 and the semiconductor layer 10 so that the control gate electrode 18 has a relatively positive voltage. An electric field between the control gate electrode 18 and the semiconductor layer 10 causes holes stored in the charge storage layer 14 to move through the tunnel insulating film 12 to be pulled out into the semiconductor layer 10.

In this state, the threshold of the transistor of the memory cell is lower compared with the data "0" state. That is, it is a state where the transistor is easy to turn on. This state is data "1."

When data is read, a voltage is applied between the source region 20 and the drain region 22. For example, in the data "0" state where holes are stored, the threshold of the transistor is high, so that an inversion layer is not formed in the channel region 24 and current does not flow between the source and the drain.

On the other hand, in an erased state, that is, the data "1" state where charges are not stored, the threshold of the transistor is low, so that an inversion layer is formed in the channel region 24 and current flows between the source and the drain. Thus, by detecting the amount of current of the transistor, it can be read whether it is data "0" or data "1."

In a data verifying operation for verifying whether or not writing has been sufficiently done after performing the data writing operation, an operation similar to that in the reading operation is performed. A voltage is applied between the source region 20 and the drain region 22. When a desired current does not flow, the data writing operation is performed again.

Next, a method of manufacturing the semiconductor memory device in this embodiment will be described.

A method of manufacturing the nonvolatile semiconductor memory device in this embodiment includes forming a tunnel insulating film 12 on a semiconductor layer 10, forming a charge storage layer 14 on the tunnel insulating film 12, forming a block insulating film 16 on the charge storage layer 14, and forming a control gate electrode 18 on the block insulating film 16.

For example, the tunnel insulating film 12 is formed on the semiconductor layer 10 of single crystal silicon. When the tunnel insulating film 12 is a silicon oxide, it can be formed by introducing a silicon substrate in a thermal oxidation furnace and forcefully oxidizing it, for example.

Alternatively, the tunnel insulating film 12 may be formed by an apparatus for deposition such as ALD or sputtering. When it is deposited, an insulating film after deposition is desirably annealed by a rapid thermal annealing (RTA) apparatus.

Next, the charge storage layer 14 is formed on the tunnel insulating film 12.

For forming the charge storage layer 14, the following method can be used, for example.

First, a surface of the tunnel insulating film 12 to be a base on which to form the charge storage layer 14 is cleaned. For the cleaning, for example, cleaning with a mixed solution of sulfuric acid and a hydrogen peroxide solution (the mixture ratio is 2:1, for example), or UV cleaning in which the insulating film surface is irradiated with ultraviolet light can be used.

Next, charge storage molecules 25 having the molecular structure of the molecular formula (1) are prepared. The cleaned surface of the tunnel insulating film 12 is immersed into a solution in which the charge storage molecules 25 in a state before being bonded to the base are dissolved in a solvent. Modifying substituents $Y_a$ are caused to react with the surface of the tunnel insulating film 12.

The charge storage molecules 25 in the state before being bonded to the base are such that the linker of the charge storage molecules 25 is a hydrogenated substance, a halogenated substance, a methoxy substance, an ethoxy substance, or the like before being bonded to the base, for example, a hydroxy group, a trimethoxysilyl group, a dimethylmethoxysilyl group, a diethylmethoxysilyl group, a triethoxysilyl group, a dimethylethoxysilyl group, a diethylethoxysilyl group, a trichlorosilyl group, a dimethylchlorosilyl group, a diethylchlorosilyl group, a carboxy group, a sulfonyl group, a phosphonate group, a phosphonate methylester group, a phosphonate ethylester group, an amino group, or a thiol group.

For the solvent, it is considered to use one in which the charge storage molecules 25 dissolve well, and organic solvents such as acetone, toluene, ethanol, methanol, hexane, cyclohexane, benzene, chlorobenzene, xylene, tetrahydrofuran, dimethylsulfoxide, N,N-dimethylformamide, anisole, cyclohexanone, methyl methoxypropionate, and the like are considered. In some cases, there are charge storage molecules 25 that dissolve in water. In those cases, water can be used as the solvent. Solvents of mixtures of these can also be used as the solvent.

When the concentration of the charge storage molecules 25 dissolved in the solvent is too low, reaction time becomes long, and when it is too high, excessive adsorbed molecules to be removed by a rinse operation increase. Thus, an appropriate concentration is desirable. For example, the concentration is desirably about 1 to 100 mM.

At that time, in order to increase reaction between the cleaned tunnel insulating film surface and the organic substance, a catalyst may be added. As a catalyst, acetic acid, formic acid, propionic acid, trifluoroacetic acid, triethylamine, ammonia, or the like that dissolves in a solvent is used. When the amount of addition of the catalyst is too large, the organic substance self-reacts in the solvent, causing side reaction such as polymerization. Thus it is desirable to make it small. Desirably, it is 3% or less relative to the volume of the solution.

A period of time for which the surface of the insulating film is immersed in the solution of the charge storage molecules 25 is desirably a period of time enough for sufficient reaction. Specifically, it is desirable to wait one minute or more.

Thereafter, it is immersed in the used solvent and rinsed using an ultrasonic cleaning machine. This operation is desirably performed at least two times or more with the solvent replaced with a new one so as to wash away an excessively physically adsorbed organic substance.

Next, it is immersed in ethanol and rinsed using an ultrasonic cleaning machine likewise.

Thereafter, the solvent is removed by a nitrogen air gun or a spin coater from it, which is dried. With this, the charge storage layer 14 composed of the charge storage molecules 25 is formed on the tunnel insulating film 12.

Thereafter, for example, a hafnium oxide film is deposited on the charge storage layer 14 to form the block insulating film 16.

The block insulating film 16 can be formed by an apparatus for deposition such as atomic layer deposition (ALD) or spattering. The deposition apparatus is desirably a deposition apparatus causing low damage by which the charge storage layer 14 formed by organic molecules is not decomposed, and is desirably a thermal-type ALD apparatus, for example. It is desirable to anneal the insulating film after deposition by a rapid thermal annealing (RTA) apparatus because it increases the atom density in the film.

Thereafter, a polycrystalline silicon film doped with impurities is formed by a chemical vapor deposition (CVD) method, for example, to form the control gate electrode 18. Thereafter, the deposited film is patterned to form a gate electrode structure.

Thereafter, for example, p-type impurities are ion-implanted with the control gate electrode 18 as a mask to form the source region 20 and the drain region 22. Thus, the nonvolatile semiconductor memory device shown in FIG. 1 can be produced.

As above, according to this embodiment, by using the charge storage molecules 25 having the molecular structure of the molecular formula (1) for the charge storage layer 14, a nonvolatile semiconductor memory device having excellent charge retention characteristics can be realized.

Second Embodiment

A nonvolatile semiconductor memory device in this embodiment is different from that in the first embodiment in that it does not include a tunnel insulating film, and a charge storage layer has the function of a tunnel insulating film. Hereinafter, contents overlapping with those in the first embodiment will not be described.

Figure 6:
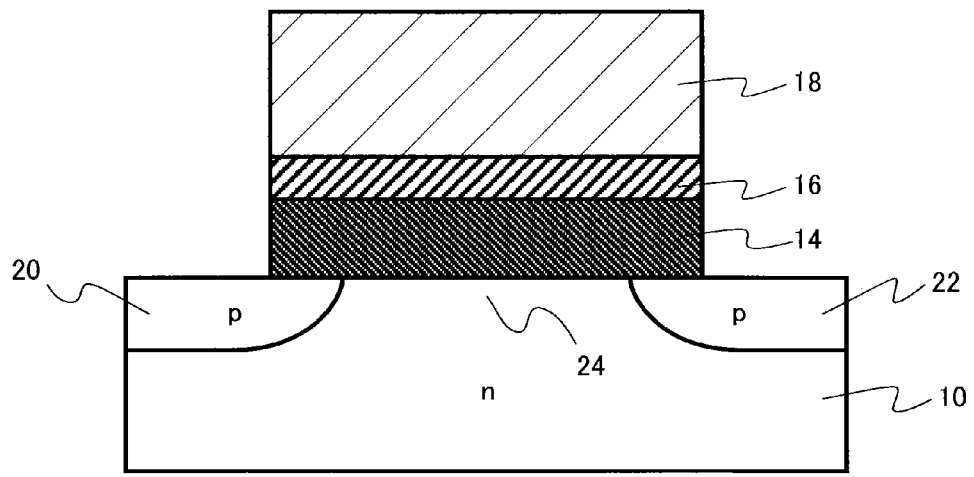
FIG. 6 is a cross-sectional view of a memory cell portion of a nonvolatile semiconductor memory device in a second embodiment.

FIG. 6 is a cross-sectional view of a memory cell portion of the nonvolatile semiconductor memory device in this embodiment.

A memory cell is formed on a semiconductor layer 10 of n-type silicon containing n-type impurities, for example. The memory cell includes a charge storage layer 14 on the silicon semiconductor layer 10, a block insulating film 16 on the charge storage layer 14, and a control gate electrode 18 on the block insulating film 16. A source region 20 and a drain region 22 are formed in the semiconductor layer 10 on opposite sides of the control gate electrode 18. A region in the semiconductor layer 10 below the control gate electrode 18 constitutes a channel region 24. The channel region 24 is interposed between the source region 20 and the drain region 22.

In this embodiment, charge storage molecules 25 in the charge storage layer 14 also have the function of a tunnel insulating film. In this embodiment, the charge storage molecules 25 are directly chemically bonded to the semiconductor layer 10.

As in the first embodiment, the charge storage molecules 25 have the function of storing charges to provide data on the memory cell.

Alkyl chain portions of the charge storage molecules 25 develop the function of keeping insulation from the semiconductor layer 10. The charge storage molecules 25 are each an alkyl chain in which the carbon number (n) of an alkyl chain portion is six or more to thirty or less in the molecular formula (3), for example.

The carbon number of the alkyl chain is six or more to thirty or less, and is more desirably ten or more to twenty or less. This is because when it falls below the above range, insulation resistance can degrade and a self-assembled monolayer can be difficult to form. Also, this is because when it exceeds the above range, the film thickness can be large, making miniaturization difficult.

A method of manufacturing the nonvolatile semiconductor memory device in this embodiment includes forming a charge storage layer 14 containing charge storage molecules 25 having the molecular structure of the molecular formula (3) on a semiconductor layer 10 by self-assembly, forming a block insulating film 16 on the charge storage layer 14, and forming a control gate electrode 18 on the block insulating film 16.

For example, the charge storage layer 14 is formed by self-assembly on the semiconductor layer (semiconductor substrate) 10 of single crystal silicon.

The method is identical to that in the first embodiment except that the charge storage layer 14 is directly formed on the semiconductor layer 10.

According to this embodiment, in place of a tunnel insulating film of an inorganic substance such as an oxide, the charge storage layer 14 implements the function of the tunnel insulating film. Therefore, the physical film thickness of the memory cell structure can be reduced. Thus, a nonvolatile semiconductor memory device with a minute memory cell can be realized.

Further, since the need to form an inorganic tunnel insulating film is eliminated, simplification of the manufacturing process can be achieved.

Further, it is also possible to cause the organic molecular layer 14 to have the function of a block insulating film by, for example, providing an alkyl chain or the like to the control gate electrode 18 side of the charge storage molecules 25 in the organic molecular layer 14, so as to provide a structure in which the block insulating film 16 of an inorganic substance such as an oxide is omitted.

Third Embodiment

A nonvolatile semiconductor memory device in this embodiment is identical to that in the first embodiment except that a conductive layer is formed between a tunnel insulating film and a charge storage layer. Hereinafter, contents overlapping with those in the first embodiment will not be described.

Figure 7:
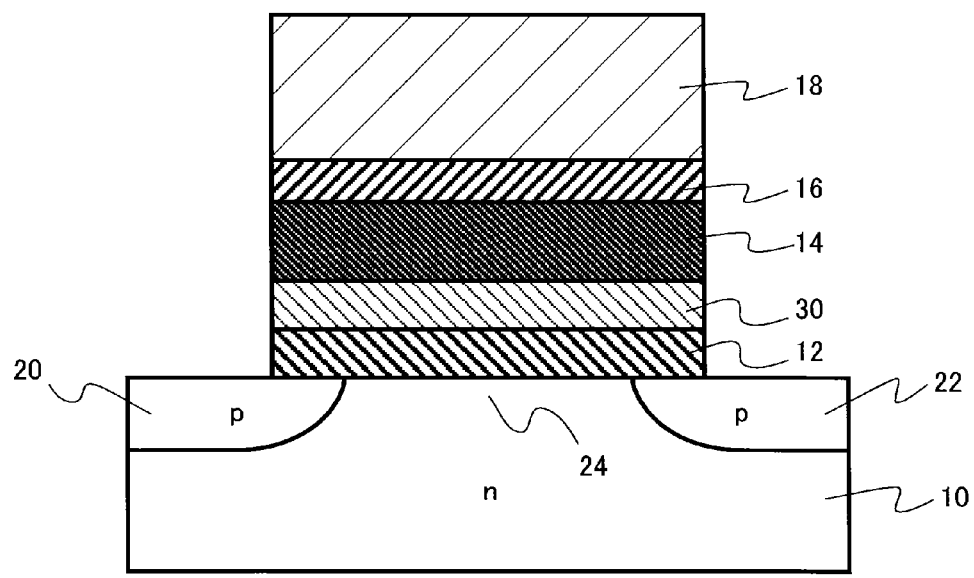
FIG. 7 is a cross-sectional view of a memory cell portion of a nonvolatile semiconductor memory device in a third embodiment.

FIG. 7 is a cross-sectional view of a memory cell portion of the nonvolatile semiconductor memory device in this embodiment.

A memory cell is formed on a semiconductor layer 10 of n-type silicon containing n-type impurities, for example. The memory cell includes a tunnel insulating film 12 on the silicon semiconductor layer 10, a conductive layer 30 on the tunnel insulating film 12, a charge storage layer 14 on the conductive layer 30, a block insulating film 16 on the charge storage layer 14, and a control gate electrode 18 on the block insulating film 16. A source region 20 and a drain region 22 are formed in the semiconductor layer 10 on opposite sides of the control gate electrode 18. A region in the semiconductor layer 10 below the control gate electrode 18 constitutes a channel region 24. The channel region 24 is interposed between the source region 20 and the drain region 22.

The conductive layer 30 has the function of uniformly dispersing charges to be stored in the charge storage layer 14. Therefore, a uniform fixed charge concentration distribution is provided in the charge storage layer 14, realizing a stable operation. The conductive layer 30 also has the function of improving efficiency in reading and writing of charges stored in the charge storage layer 14.

The conductive layer 30 is, for example, a semiconductor film, a metal film, or a metal compound film. For example, amorphous silicon or polycrystalline silicon to which impurities have been introduced and conductivity has been imparted may be used.

In this embodiment, charge storage molecules 25 are bonded onto the conductive layer 30 by self-assembly. At this time, when the conductive layer 30 is silicon, a chemically modifying group X of the charge storage molecules 25 to be a linker is desirably a thiol group in terms of facilitating the bonding.

A method of manufacturing the nonvolatile semiconductor memory device in this embodiment includes forming a tunnel insulating film 12 on a semiconductor layer 10, forming a conductive layer 30 on the tunnel insulating film 12, forming a charge storage layer 14 containing charge storage molecules 25 having the molecular structure of the molecular formula (1) on the conductive layer 30, forming a block insulating film 16 on the charge storage layer 14 by an ALD method, and forming a control gate electrode 18 on the block insulating film 16.

The conductive layer 30 is formed on the tunnel insulating film 12 by a CVD method, an ALD method, a spattering method, or the like, for example. The charge storage layer 14 is formed on the conductive layer 30.

The method is identical to that in the first embodiment except that the tunnel insulating film 12 is formed on the semiconductor layer 10, and the charge storage layer 14 is formed on the conductive layer 30.

According to this embodiment, a nonvolatile semiconductor memory device stable in operation and excellent in reading and writing characteristics can be realized.

Fourth Embodiment

A nonvolatile semiconductor memory device in this embodiment is identical to that in the first embodiment except that a transistor of a memory cell is an n-type transistor which uses electrons as carriers. Accordingly, contents overlapping with those in the first embodiment will not be described.

Figure 8:
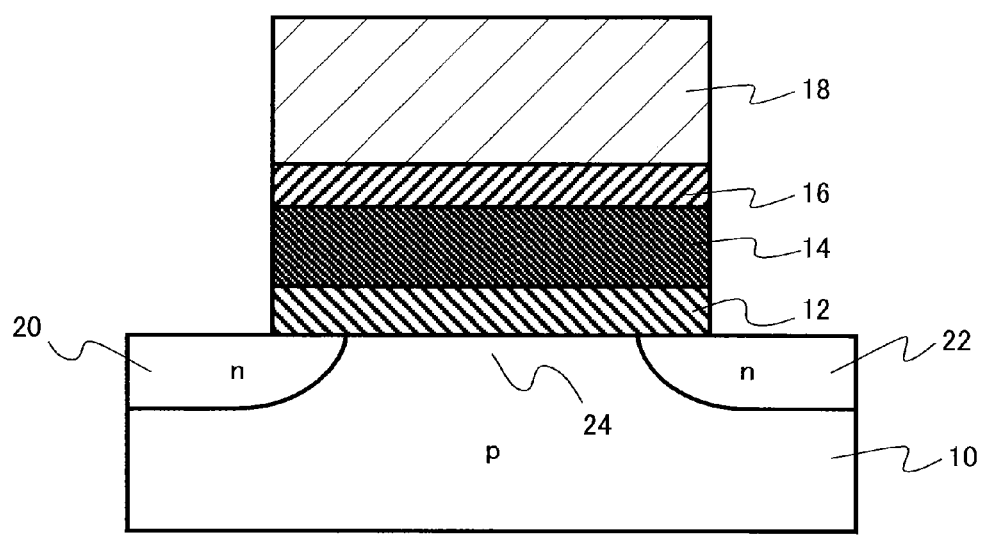
FIG. 8 is a cross-sectional view of a memory cell portion of a nonvolatile semiconductor memory device in a fourth embodiment.

FIG. 8 is a cross-sectional view of a memory cell portion of the nonvolatile semiconductor memory device in this embodiment.

A memory cell is formed on a semiconductor layer 10 of single crystal p-type silicon containing p-type impurities, for example. The memory cell includes a tunnel insulating film 12 on the silicon semiconductor layer 10, a charge storage layer 14 on the tunnel insulating film 12, a block insulating film 16 on the charge storage layer 14, and a control gate electrode 18 on the block insulating film 16. A source region 20 and a drain region 22 are formed in the semiconductor layer 10 on opposite sides of the control gate electrode 18. A region in the semiconductor layer 10 below the control gate electrode 18 constitutes a channel region 24. The channel region 24 is interposed between the source region 20 and the drain region 22.

The source region 20 and the drain region 22 are formed by an n-type diffusion layer containing n-type impurities, for example.

In a memory cell writing operation in this embodiment, a voltage is applied between the control gate electrode 18 and the semiconductor layer 10 so that the control gate electrode 18 has a relatively positive voltage to store negative charges in the charge storage layer 14. When the control gate electrode 18 has a relatively positive voltage, an inversion layer is formed in the channel region 24 to store electrons. The electrons move through the tunnel insulating film 12 to be stored in the charge storage molecules in the charge storage layer 14.

In this state, the threshold of the transistor of the memory cell is higher compared with a state where electrons are not stored. That is, it is a state where the transistor is hard to turn on. This state is a state where data "0" is written.

In a data erasing operation, a voltage is applied between the control gate electrode 18 and the semiconductor layer 10 so that the control gate electrode 18 has a relatively negative voltage. An electric field between the control gate electrode 18 and the semiconductor layer 10 causes electrons stored in the charge storage layer 14 to move through the tunnel insulating film 12 to be pulled out into the semiconductor layer 10.

In this state, the threshold of the transistor of the memory cell is lower compared with the data "0" state. That is, it is a state where the transistor is easy to turn on. This state is data "1."

When data is read, a voltage is applied between the source region 20 and the drain region 22. For example, in the data "0" state where electrons are stored, the threshold of the transistor is high, so that an inversion layer is not formed in the channel region 24 and current does not flow between the source and the drain.

On the other hand, in an erased state, that is, the data "1" state where charges are not stored, the threshold of the transistor is low, so that an inversion layer is formed in the channel region 24 and current flows between the source and the drain. Thus, by detecting the amount of current of the transistor, it can be read whether it is data "0" or data "1."

In a data verifying operation for verifying whether or not writing has been sufficiently done after performing the data writing operation, an operation similar to that in the reading operation is performed. A voltage is applied between the source region 20 and the drain region 22. When a desired current does not flow, the data writing operation is performed again.

The writing, erasing, and reading operations of the memory cell in this embodiment are performed as above for the function as a nonvolatile semiconductor memory device.

Also in this embodiment, as in the first embodiment, by using the charge storage molecules 25 having the molecular structure of the molecular formula (1) for the charge storage layer 14, a nonvolatile semiconductor memory device having excellent charge retention characteristics can be realized.

Fifth Embodiment

A nonvolatile semiconductor memory device in this embodiment includes a stacked body in which insulating layers and control gate electrodes are alternately stacked in layers, a semiconductor layer provided in the stacked body facing the control gate electrodes, and an organic molecular layer having organic molecules containing the molecular structure described by the above-described molecular formula (1) provided between the semiconductor layer and the control gate electrodes.

The nonvolatile semiconductor memory device in this embodiment is different from that in the first embodiment in that it is a device having a three-dimensional structure. Contents overlapping with those in the first embodiment will not be described.

Figure 9:
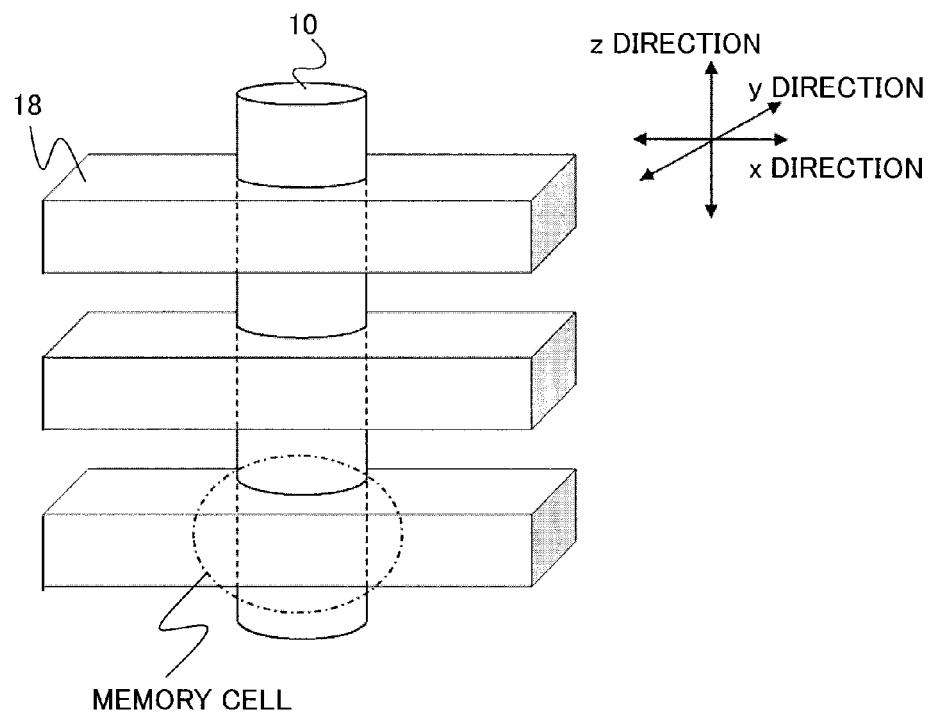
FIG. 9 is a three-dimensional conceptual diagram of a nonvolatile semiconductor memory device in a fifth embodiment.
Figure 10:
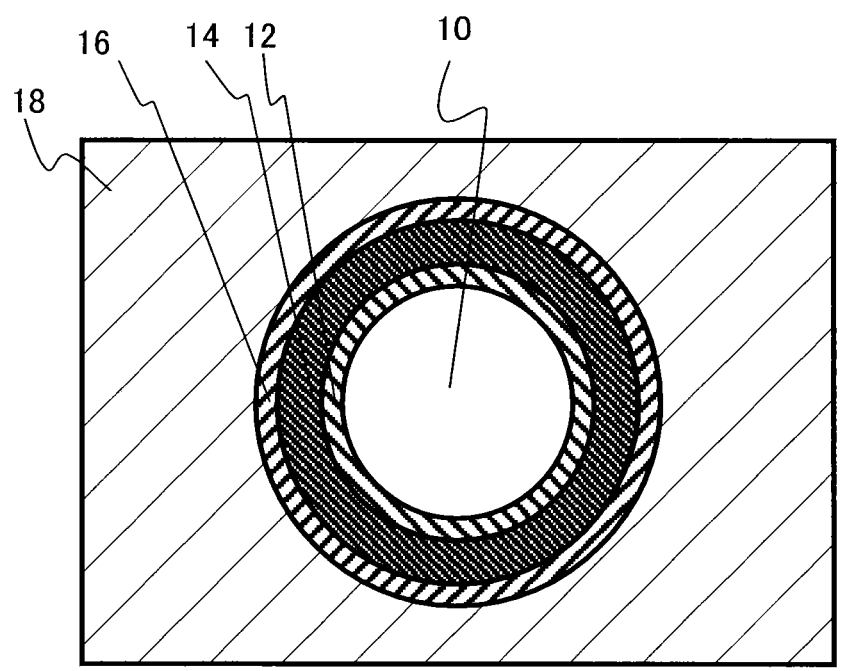
FIG. 10 is an XY cross-sectional view of FIG. 9.
Figure 10:
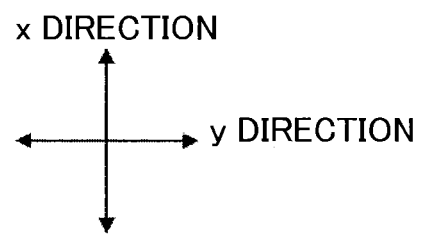
Figure 11:
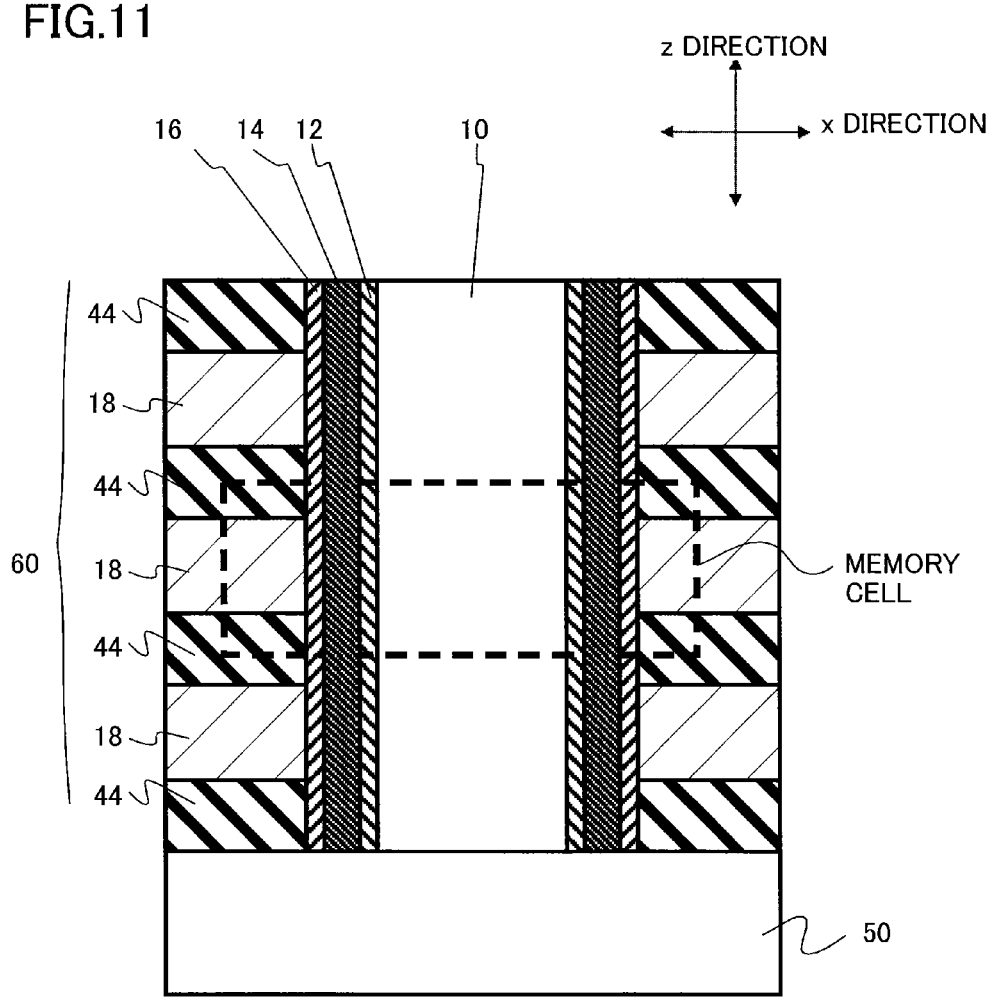
FIG. 11 is an XZ cross-sectional view of FIG. 9.

FIG. 9 is a three-dimensional conceptual diagram of the nonvolatile semiconductor memory device in this embodiment. FIG. 10 is an XY cross-sectional view of FIG. 9. FIG. 11 is an XZ cross-sectional view of FIG. 9.

The nonvolatile semiconductor memory device in this embodiment includes, for example, a stacked body 60 in which insulating layers 44 and control gate electrodes 18 are alternately stacked in layers on a silicon substrate 50.

A hole penetrating from an upper surface of the stacked body 60 to the control gate electrode 18 in the lowermost layer is provided, for example. A block insulating film 16 is provided on the side surface of the hole. A charge storage layer 14 is provided on the inner surface of the block insulating film 16.

A tunnel insulating film 12 is provided on the inner surface of the charge storage layer 14. A columnar semiconductor layer 10 is formed on the inner surface of the tunnel insulating film 12. The semiconductor layer 10 does not necessarily need to be a column, and may be a film, for example.

In other words, the semiconductor layer 10 provided opposite to the control gate electrodes 18 is provided. The tunnel insulating film 12, the charge storage layer 14, and the block insulating film 16 are provided between the semiconductor layer 10 and the control gate electrodes 18.

In FIGS. 9 and 11, a region enclosed by a broken line is a single memory cell. The structure of the memory cell is a structure in which the tunnel insulating film 12, the charge storage layer 14, and the block insulating film 16 are formed between the semiconductor layer 10 and the control gate electrode 18.

Charge storage molecules 25 in the charge storage layer 14 may be chemically bonded to either of the semiconductor layer 10 side and the control gate electrode 18 side via $Y_a$ in the molecular formula (1). For example, the charge storage molecules 25 may be configured to be chemically bonded to the tunnel insulating film 12 by a linker. Alternatively, for example, the charge storage molecules 25 may be configured to be chemically bonded to the block insulating film 16 by a linker.

The three-dimensional structure in this embodiment can be manufactured by using a known method of manufacturing a three-dimensional structure nonvolatile semiconductor memory device.

The nonvolatile semiconductor memory device in this embodiment improves charge retention characteristics by using the charge storage molecules 25 having the molecular structure of the molecular formula (1) for the charge storage layer 14. Further, according to this embodiment, by making memory cells three-dimensional, the density of the memory cells can be increased, and a nonvolatile semiconductor memory device having a still higher density than those in the first to fourth embodiments can be realized.

Sixth Embodiment

A nonvolatile semiconductor memory device in this embodiment is different from that in the fifth embodiment in that block insulating film is formed between insulating layer and control gate electrode. Contents overlapping with those in the fifth embodiment will not be described.

Figure 12:
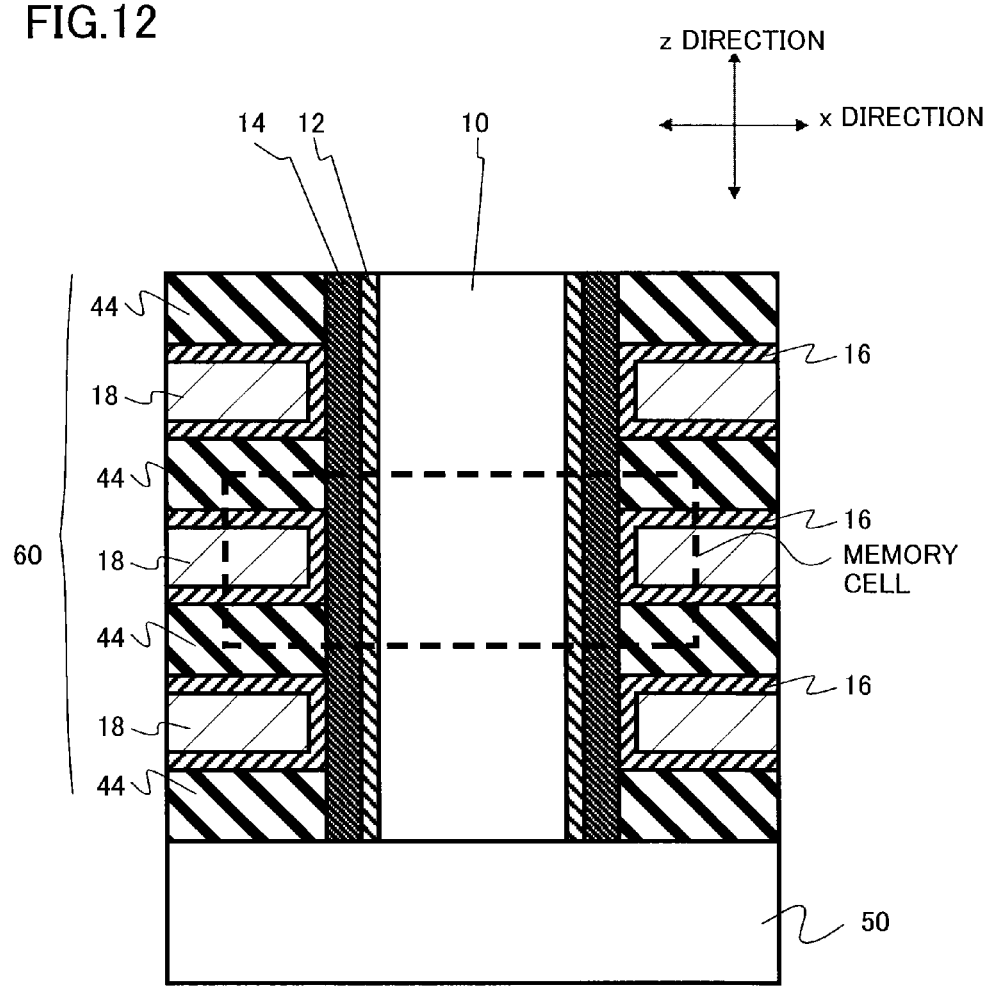
FIG. 12 is an XZ cross-sectional view of a nonvolatile semiconductor memory device in a sixth embodiment.

FIG. 12 is an XZ cross-sectional view of the nonvolatile semiconductor memory device in this embodiment. FIG. 12 corresponds to FIG. 11 of the fifth embodiment.

In this embodiment, block insulating film 16 is formed between insulating layer 44 and control gate electrode 18. In other words, the block insulating film 16 is formed along a surface of the control gate electrode 18.

The nonvolatile semiconductor memory device in this embodiment improves charge retention characteristics by using the charge storage molecules 25 having the molecular structure of the molecular formula (1) for the charge storage layer 14. Further, according to this embodiment, by making memory cells three-dimensional, the density of the memory cells can be increased, and a nonvolatile semiconductor memory device having a still higher density than those in the first to fourth embodiments can be realized.

EXAMPLES

Hereinafter, examples will be described.

Example 1

A four-terminal transistor device was produced by the following method.

A p-type silicon substrate was patterned with a photoresist, and subjected to phosphorus ion implantation to form an n-type channel region. Next, a tunnel insulating film of a silicon oxide was formed on the channel region in a thermal oxidation furnace. The film thickness of the silicon oxide was about 5 nm from the result of a film thickness measurement.

The substrate formed with the tunnel insulating film was cleaned by irradiating the surface of the formed silicon oxide film by a UV cleaning machine for ten minutes. The cleaned substrate was immersed into a solution in which molecules having the molecular structure of above-described Molecule Example 1 were dissolved in dehydrated toluene at a concentration of 1 mM, to which trifluoroacetic acid was added at a concentration of 3%, and left for twenty-four hours.

Thereafter, the substrate was taken out from the solution, moved into pure toluene, and rinsed while being given stimulus by an ultrasonic cleaning machine for one minute. The rinse operation with toluene was performed two times in total with toluene replaced with new one. Further, the substrate rinsed with toluene was moved into pure ethanol, rinsed while being given stimulus by an ultrasonic cleaning machine for one minute, and dried using an air duster, to form a charge storage monomolecular film made from the material of above-described Molecule Example 1 on the substrate.

Next, the substrate was introduced into a thermal-type atomic layer deposition (ALD) apparatus to form a block insulating film of a hafnium oxide on the charge storage monomolecular film at 150° C. The block insulating film of the hafnium oxide is formed by about 20 nm in film thickness.

Next, it was introduced into a rapid thermal annealing (RTA) apparatus and annealed under an $N_2$ gas atmosphere in which 3% $H_2$ was mixed, at 300° C. for thirty minutes. Then, nickel was deposited on the hafnium oxide by about 100 nm by an electron beam (EB) vapor deposition apparatus. The evaporated nickel film was patterned with a photoresist to form a gate electrode with only the channel region left.

Next, source and drain regions to be connected to the channel region were patterned with a photoresist, wet etched with buffered hydrofluoric acid to expose the silicon surface. Aluminum was evaporated onto the surface by about 100 nm to form source and drain electrodes. The rear surface of the substrate was wet etched with hydrofluoric acid and cleaned. Aluminum was evaporated thereon by about 200 nm to form a substrate electrode. Thus the transistor device including four terminals, a gate, a source, a drain, and a substrate, was produced.

Example 2

A transistor device was produced by a method identical to that in Example 1 except that the film thickness of a block film of a hafnium oxide was made about 10 nm.

Comparative Example 1

A transistor device was produced by a method identical to that in Example 1 except that molecules having the molecular structure of the above-described comparative molecule example were used.

Comparative Example 2

A transistor device was produced by a method identical to that in Example 2 except that molecules having the molecular structure of the above-described comparative molecule example were used.

Writing was performed by applying a voltage of −20 V for a period of 100 ms to the gate electrodes of the transistor devices in Example 1 and Comparative Example 1. The resulting threshold voltage shifts were read and followed relative to elapsed time. Reading was performed by reading a drain current obtained by applying a source-drain voltage of 0.1 V constantly and applying a gate voltage between −3 V to 3 V. A voltage at which a drain current of $1 \times 10^{-7}$ A flowed was set as a threshold voltage.

Figure 13:
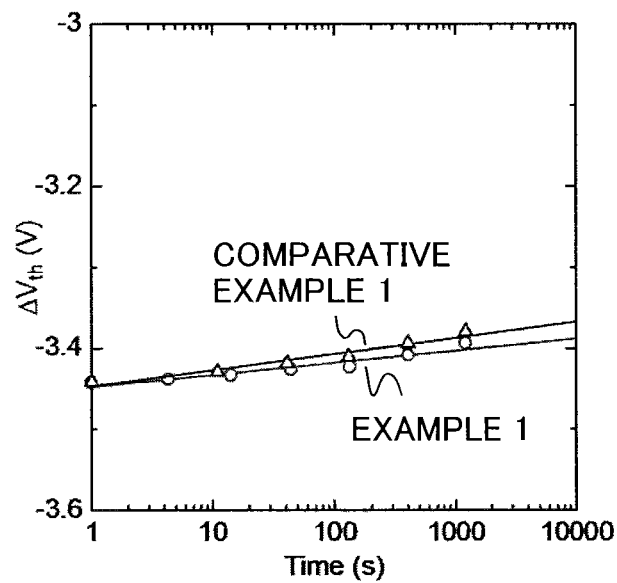
FIG. 13 is a graph showing charge retention characteristics of Example 1 and Comparative Example 1.

FIG. 13 is a graph showing charge retention characteristics in Example 1 and Comparative Example 1. It shows changes over time of the threshold voltage shifts.

When elapsed time at which initial values of the threshold voltage shifts decay 5% was calculated by linearly logarithmically approximating the changes over time of the threshold voltage shifts obtained in FIG. 13, it is about 9014 years in Example 1, and about 13.7 years in Comparative Example 1. It was found that the charge retention time in Example 1 was longer and superior.

Writing was performed by applying a voltage of −15 V for a period of 100 ms to the gate electrodes of the transistor devices in Example 2 and Comparative Example 2. The resulting threshold voltage shifts were read and followed relative to elapsed time. Reading was performed likewise by reading a drain current obtained by applying a source-drain voltage of 0.1 V constantly and applying a gate voltage between −2 V to 3 V. A voltage at which a drain current of $1 \times 10^{-7}$ A flowed was set as a threshold voltage.

Figure 14:
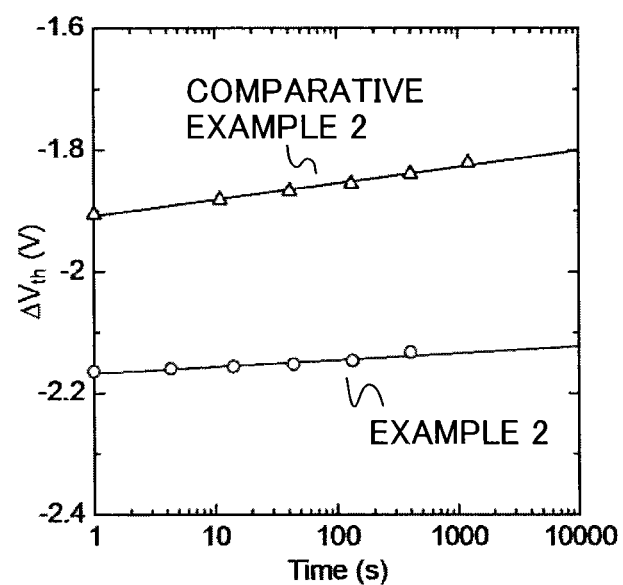
FIG. 14 is a graph showing charge retention characteristics of Example 2 and Comparative Example 2.

FIG. 14 is a graph showing charge retention characteristics in Example 2 and Comparative Example 2. It shows changes over time of the threshold voltage shifts.

When elapsed time at which initial values of the threshold voltage shifts decay 5% was calculated by linearly logarithmically approximating the changes over time of the threshold voltage shifts obtained in FIG. 14, it is about 146 years in Example 2, and about 57.1 minutes in Comparative Example 2. It was found that the charge retention time in Example 2 was clearly longer and superior. The results of FIG. 13 show that even when the block film thickness is made thin to 10 nm, by using the charge storage monomolecular film of the present disclosure, charge retention time of ten years or more can be achieved, the industrial importance of which is enormous.

While certain embodiments have been described, these embodiments have been presented by way of example only, and are not intended to limit the scope of the inventions. Indeed, the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a semiconductor layer;
   a control gate electrode; and
   an organic molecular layer provided between the semiconductor layer and the control gate electrode, the organic molecular layer having an organic molecule including a molecular structure described by a molecular formula (1):

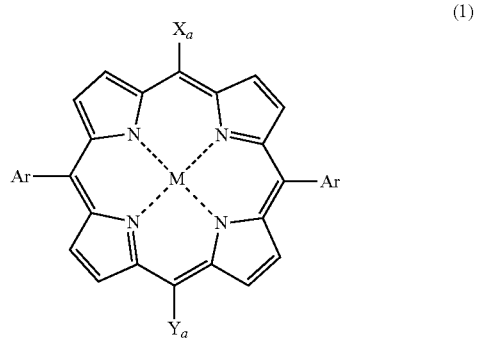

wherein $X_a$ is an aryl group having a substituent selected from a nitro group, an amino group, a tosyl group, an alkylamino group, a cyano group, and a fluoro group, $Y_a$ is an aryl group different from $X_a$, Ar is an aryl group different from $X_a$, and M is a metal ion selected from Zn, Fe, Mn, Pt, Ni, and Co.

2. The device according to claim 1, wherein $Y_a$ has a substituent chemically bonded to a semiconductor layer side or a control gate electrode side.

3. The device according to claim 1, wherein $X_a$, Ar, and $Y_a$ in the molecular formula (1) include a phenyl group.

4. The device according to claim 1, wherein Ar in the molecular formula (1) is an aryl group composed only of carbon and hydrogen.

5. The device according to claim 1, wherein the organic molecular layer is a monomolecular film.

6. The device according to claim 1, wherein the organic molecule includes a molecular structure described by a molecular formula (2):

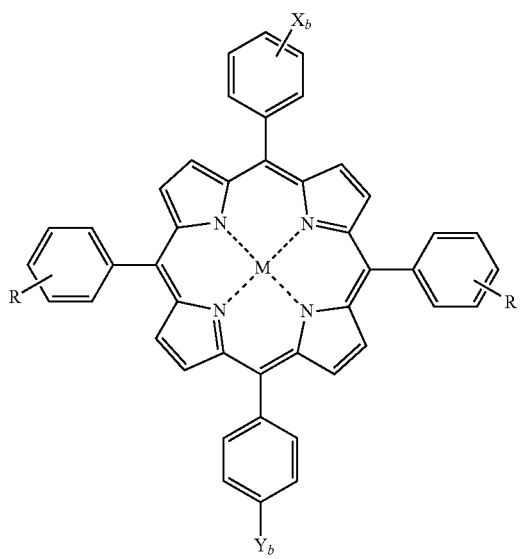

(2)

wherein $X_b$ is a substituent selected from a nitro group, an amino group, a tosyl group, an alkylamino group, a cyano group, and a fluoro group, $Y_b$ is a substituent chemically bonded to a semiconductor layer side or a control gate electrode side, M is a metal ion selected from Zn, Fe, Mn, Pt, Ni, and Co, and R is a saturated aliphatic group.

7. The device according to claim 6, wherein R in the molecular formula (2) has an ether linkage.

8. The device according to claim 1, wherein the organic molecule includes a molecular structure described by a molecular formula (3):

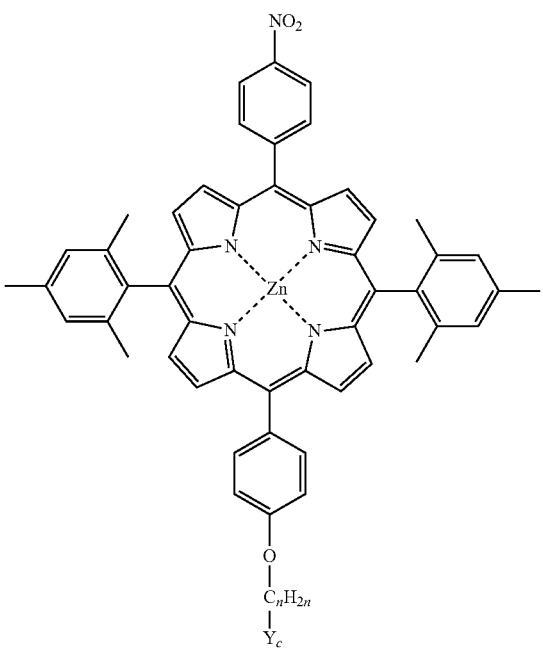

(3)

wherein $Y_c$ is a substituent chemically bonded to a semiconductor layer side or a control gate electrode side, and n is an integer of one or more to thirty or less.

9. The device according to claim 1, wherein the organic molecule includes a molecular structure described by a molecular formula (4):

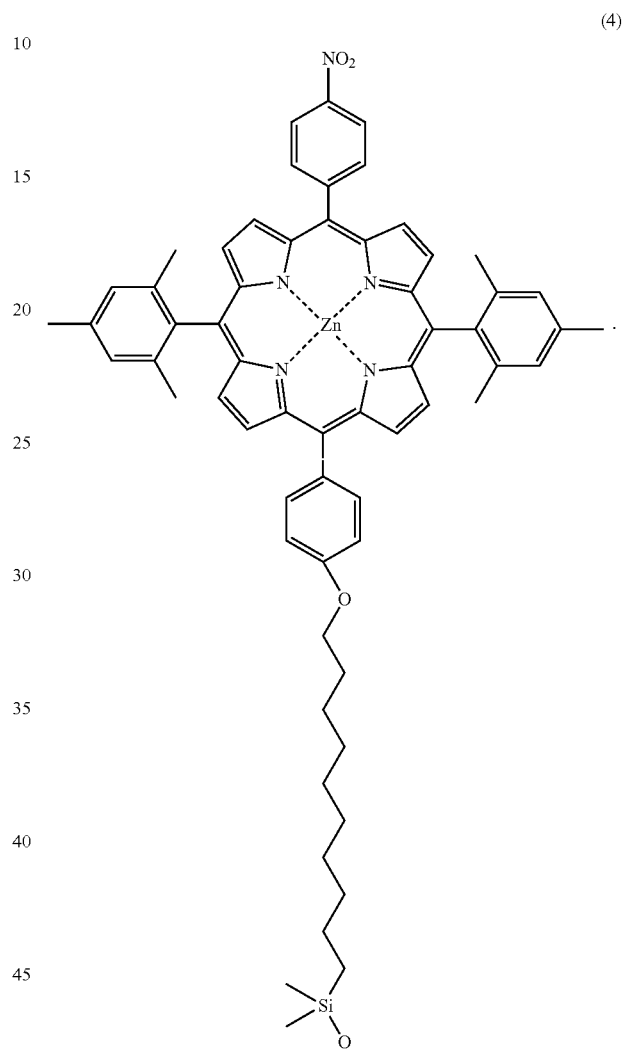

(4)

10. The device according to claim 1, further comprising a block insulating film provided between the control gate electrode and the organic molecular layer.

11. The device according to claim 1, further comprising a tunnel insulating film provided between the semiconductor layer and the organic molecular layer.

12. The device according to claim 10, wherein the block insulating film has at least one oxide film selected from a hafnium oxide, an aluminum oxide, a silicon oxide, a zirconium oxide, and a titanium oxide.

13. The device according to claim 11, wherein the tunnel insulating film is a silicon oxide film.

14. A semiconductor memory device comprising:
a stacked body having insulating layers and control gate electrodes alternately stacked;
a semiconductor layer provided in the stacked body, the semiconductor layer facing the control gate electrodes; and an organic molecular layer provided between the semiconductor layer and one of the control gate electrodes, the organic molecular layer having an organic molecule including a molecular structure described by a molecular formula (1):

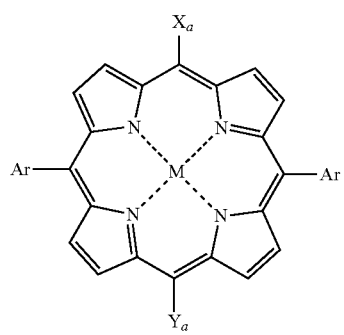

(1)

wherein $X_a$ is an aryl group having a substituent selected from a nitro group, an amino group, a tosyl group, an alkylamino group, a cyano group, and a fluoro group, $Y_a$ is an aryl group different from $X_a$, Ar is an aryl group different from $X_a$, and M is a metal ion selected from Zn, Fe, Mn, Pt, Ni, and Co.

15. The device according to claim 14, wherein $Y_a$ has a substituent chemically bonded to a semiconductor layer side or a control gate electrodes side.

16. The device according to claim 14, wherein $X_a$, Ar, and $Y_a$ in the molecular formula (1) include a phenyl group.

17. The device according to claim 14, wherein Ar in the molecular formula (1) is an aryl group composed only of carbon and hydrogen.

18. The device according to claim 14, wherein the organic molecular layer is a monomolecular film.

19. The device according to claim 14, wherein the organic molecule includes a molecular structure described by a molecular formula (2):

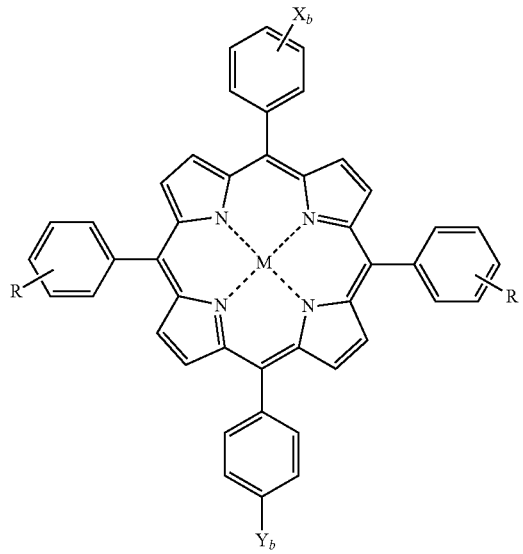

(2)

wherein $X_b$ is a substituent selected from a nitro group, an amino group, a tosyl group, an alkylamino group, a cyano group, and a fluoro group, $Y_b$ is a substituent chemically bonded to a semiconductor layer side or a control gate electrode side, M is a metal ion selected from Zn, Fe, Mn, Pt, Ni, and Co, and R is a saturated aliphatic group.

20. The device according to claim 19, wherein R in the molecular formula (2) has an ether linkage.

* * * * *